United States Patent
Honda (10) Patent No.: US 8,552,428 B2
(45) Date of Patent: Oct. 8, 2013

(54) POWER SEMICONDUCTOR DEVICE (75) Inventor: Shigeto Honda, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 288 days.

(21) Appl. No.: 12/962,079

(22) Filed: Dec. 7, 2010

(65) Prior Publication Data
US 2011/0233544 A1 Sep. 29, 2011

(30) Foreign Application Priority Data
Mar. 29, 2010 (JP) ................. 2010-074916

(51) Int. Cl.
H01L 23/58 (2006.01)
H01L 31/0256 (2006.01)
H01L 31/0312 (2006.01)
H01L 29/76 (2006.01)
H01L 29/94 (2006.01)
H01L 31/062 (2012.01)
H01L 31/113 (2006.01)
H01L 31/119 (2006.01)

(52) U.S. Cl.
USPC ............. 257/48; 257/76; 257/77; 257/329; 257/E29.262; 257/E29.336

(58) Field of Classification Search
USPC ......... 257/48, 76, 77, 329, E29.262, E29.336
See application file for complete search history.

(56) References Cited

U.S. PATENT DOCUMENTS

| 2004/0058481 A1 | 3/2004 | Xu et al. |
| 2009/0051381 A1 | 2/2009 | Hosoda et al. |
| 2009/0085116 A1 | 4/2009 | Aoki |
| 2009/0218676 A1 | 9/2009 | Muto et al. |

FOREIGN PATENT DOCUMENTS

| JP | 2009-88385 | 4/2009 |
| KR | 10-2004-0026641 | * 3/2004 |
| TW | I300485 | 8/2006 |
| TW | 200947651 | 11/2009 |

OTHER PUBLICATIONS

Office Action issued Jul. 11, 2012 in Korean Patent Application No. 10-2011-0021164 (with partial English translation).
Taiwanese Office Action dated Jun. 17, 2013 for Taiwanese Patent Application No. 1022077257001, with English translation of relevant portions thereof.

* cited by examiner

Primary Examiner — David S Blum
(74) Attorney, Agent, or Firm — Oblon, Spivak, McClelland, Maier & Neustadt, L.L.P.

(57) ABSTRACT

A power semiconductor device according to the present invention, which has a termination structure in which a field plate is provided on an insulating film filled in a recessed region formed in a semiconductor substrate and includes a plurality of unit cells connected in parallel, includes: a gate wiring region in which gate wiring electrically connected to each gate electrode of the plurality of unit cells is provided; and a gate pad region electrically connected to the gate wiring region, wherein the gate wiring region is disposed on the insulating film filled in a recessed region formed in the semiconductor substrate.

5 Claims, 6 Drawing Sheets

POWER SEMICONDUCTOR DEVICE

BACKGROUND OF THE INVENTION

1. Field of the Invention

The present invention relates to a power semiconductor device, and more particularly, to a power semiconductor device of high breakdown voltage that has a termination structure.

2. Description of the Background Art

In order to relax an electric field at an end of a depletion layer in the vicinity of a main junction surface in a termination of a power semiconductor device of high breakdown voltage such as diodes and bipolar transistors having high breakdown voltage, power metal oxide semiconductor field effect transistors (MOSFETs) and insulated gate bipolar transistors (IGBTs), there is a technology of providing a field plate structure in which a conductive film (field plate) is provided on a semiconductor substrate through an insulating film and providing a reduced surface field (RESURF) layer obtained by selectively providing a low-concentration diffusion layer of conductivity type different from that of the substrate in the vicinity of the surface of the semiconductor device, to thereby improve device breakdown voltage. In the field plate structure, for example, an Al—Si film is provided on the RESURF layer through an oxide film. When the field plate structure is provided on a junction region of the RESURF layer and a p-type layer in the vicinity of the main junction region on which an electric field is likely to be particularly concentrated, an electric field in the vicinity of the main junction region can be relaxed to improve device breakdown voltage.

In a case where an insulating film under the field plate has a small thickness in the field plate structure, avalanche occurs at an end of the field plate and a device breakdown voltage drops, and thus the insulating film is required to have a large thickness. However, formation of the insulating film causes a step in a wafer process (an entire film thickness becomes larger compared with the region in which the insulating film is not formed). Accordingly, a larger film thickness of the insulating film causes unevenness in application of a resist when the resist is applied, leading to a problem that, for example, a focus margin becomes difficult to be ensured in photolithography.

In order to solve the above-mentioned problem, the applicant(s) of the present application have proposed the termination structure in which an insulating film under a field plate is formed in a semiconductor substrate. The termination structure is formed by forming an insulating film on an entire surface of a semiconductor substrate after the formation of a recessed region in the semiconductor substrate, and planarizing the surface after the film formation by chemical mechanical polishing (CMP). Further, there is a termination structure in which a recessed region is formed in a RESURF layer formed on a surface of a semiconductor substrate and an insulating film is filled in the recessed region (for example, see Japanese Patent Application Laid-Open No. 2009-88385).

In the termination structure in which the recessed region is provided and an insulating film is formed in the recessed region, in order to prevent damage on the semiconductor substrate, it is required to leave an insulating film formed on a region (non-recessed region) other than the recessed region including a transistor cell region in performing CMP process after the formation of the insulating film on an entire surface of the semiconductor substrate. However, the distribution of thickness of the insulating film after the CMP process depends on an area of the non-recessed region surrounded by the recessed region, and the distribution of film thickness increases as the area of the non-recessed region increases (unevenness in film thickness increases). Large unevenness in film thickness leads to unevenness in characteristics.

SUMMARY OF THE INVENTION

An object of the present invention is to provide a power semiconductor device capable of reducing unevenness in characteristics by reducing unevenness in thickness of an insulating film after the CMP process.

A power semiconductor device according to the present invention, which has a termination structure in which a field plate is provided on an insulating film 3 filled in a first recessed region formed in a semiconductor substrate 1 and includes a plurality of unit cells connected in parallel, includes: a gate wiring region 12 in which gate wiring electrically connected to each gate electrode of the plurality of unit cells 10 is provided; and a gate pad region 13 electrically connected to the gate wiring region 12, wherein the gate wiring region 12 is disposed on the insulating film 3 filled in a second recessed region formed in the semiconductor substrate 1.

According to the present invention, the power semiconductor device, which has the termination structure in which the field plate is provided on the insulating film filled in the first recessed region formed in the semiconductor substrate and includes the plurality of unit cells connected in parallel, includes: the gate wiring region including gate wiring electrically connected to each gate electrode of the plurality of unit cells; and the gate pad region electrically connected to the gate wiring region, wherein the gate wiring region is disposed on the insulating film filled in the second recessed region formed in the semiconductor substrate. Accordingly, it is possible to reduce unevenness in thickness of the insulating film after the CMP process, to thereby reduce unevenness in characteristics.

These and other objects, features, aspects and advantages of the present invention will become more apparent from the following detailed description of the present invention when taken in conjunction with the accompanying drawings.

DESCRIPTION OF THE PREFERRED EMBODIMENTS

Preferred embodiments of the present invention are described with reference to the drawings.

(Underlying Technology of the Present Invention)

First, the underlying technology of the present invention is described.

Figure 8:
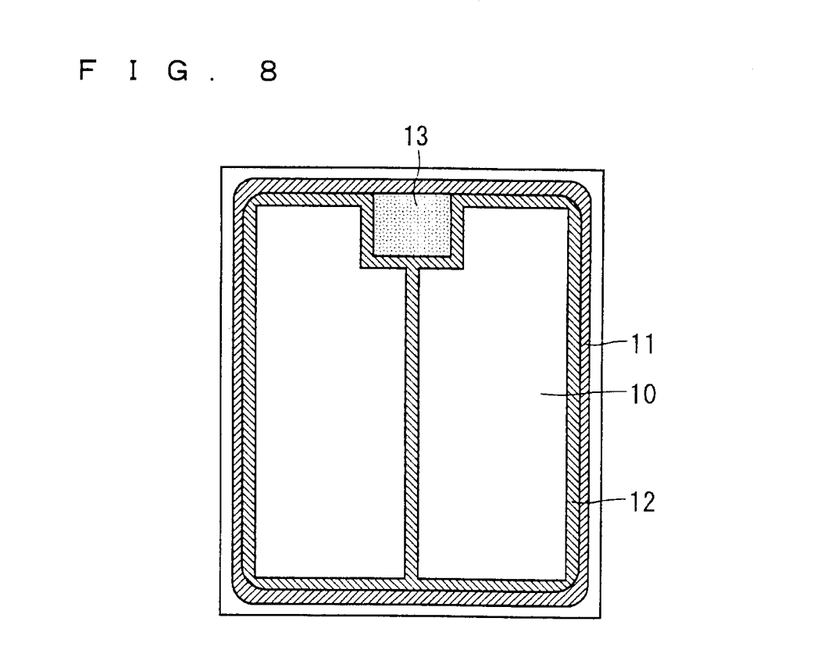
FIG. 8 is a plan view showing an example of a chip layout of a typical IGBT.

FIG. 8 is a plan view showing an example of a chip layout of a typical IGBT. FIG. 8 shows the IGBT as an example, and as shown in FIG. 8, in a power semiconductor device of high breakdown voltage that has gate functions of a power MOSFET and an IGBT, a gate wiring region 12 is provided so as to surround a transistor cell region 10. In a case where a control current of a power semiconductor device is high and an area of a transistor cell region is large, an effective gate resistance value is high in a central portion of the transistor cell region, leading to problems of a reduction in switching speed and a reduction in amount of breakdown. Therefore, as shown in FIG. 8, the transistor cell region 10 is divided into a plurality of units, and unit cells thereof are connected in parallel to form one device, with the result that an area of the transistor cell region 10 surrounded by the gate wiring region 12 is reduced. Note that reference numerals 11 and 13 denote a termination region and a gate pad, respectively.

Figure 9:
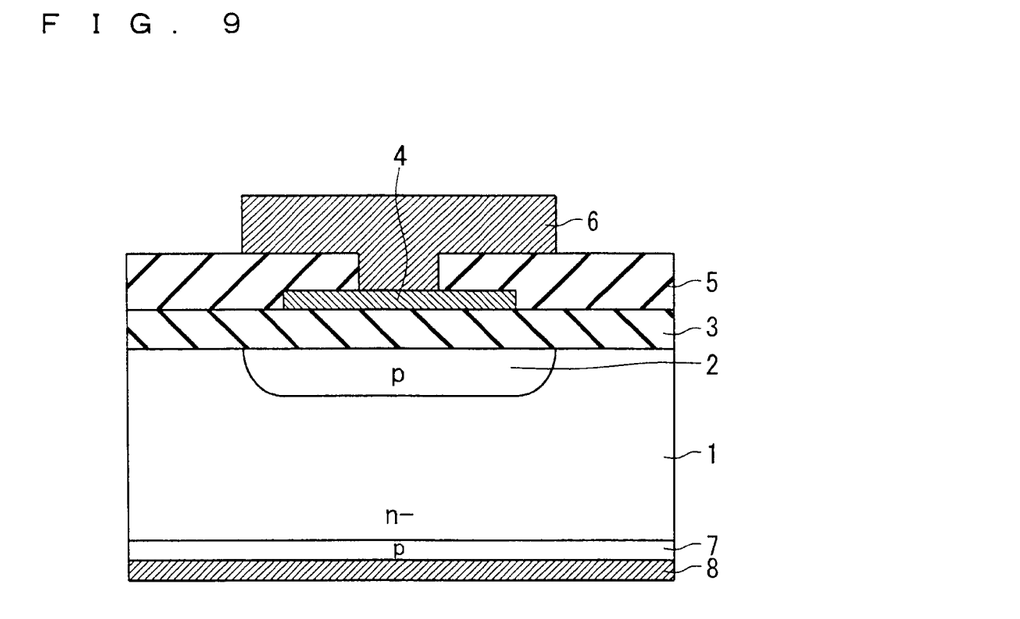
FIG. 9 is a cross-sectional view of a gate wiring region of a power semiconductor device according to the underlying technology of the present invention.

FIG. 9 is a cross-sectional view of a gate wiring region of a power semiconductor device according to the underlying technology of the present invention. As shown in FIG. 9, a gate electrode 4 formed of D-poly or the like and gate wiring formed of Al—Si electrode 6 or the like are disposed on an insulating film 3 formed on an n-type silicon semiconductor substrate 1 for electrical isolation from the n-type silicon semiconductor substrate 1. Further, a p-well region 2 is formed under the gate electrode 4 in the vicinity of the surface of the n-type silicon semiconductor substrate 1, whereby the breakdown voltage with respect to leakage between the gate electrode 4 and the n-type silicon semiconductor substrate 1 is improved.

Figure 10:
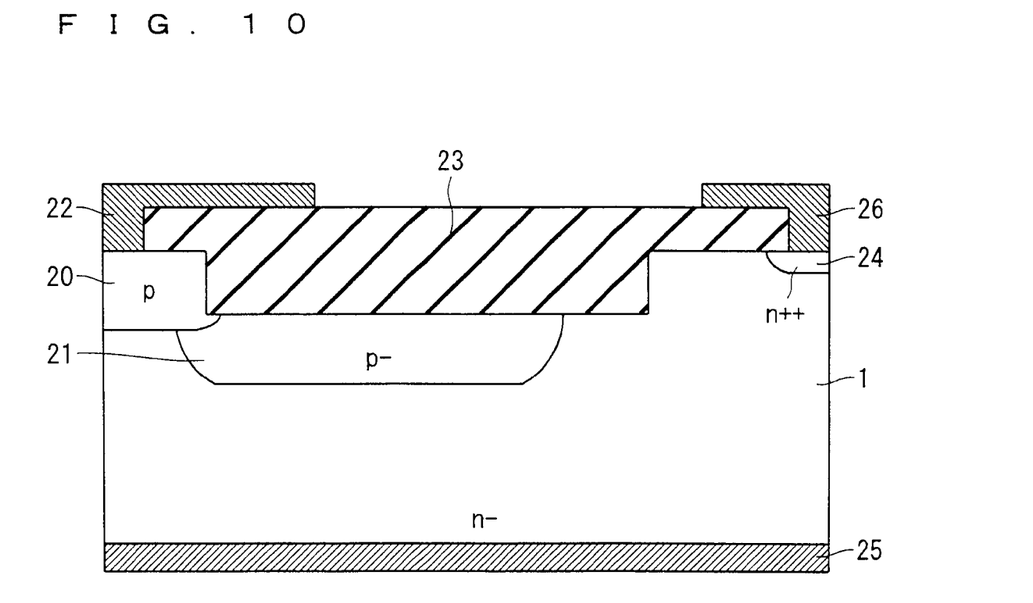
FIG. 10 is a view showing an example of a termination structure according to the underlying technology of the present invention.

FIG. 10 is a view showing an example of a termination structure in which an insulating film under a field plate is formed in a recessed region formed in a silicon semiconductor substrate according to the underlying technology of the present invention proposed by the applicants(s) of the present application. As shown in FIG. 10, an insulating film 23 is filled in the recessed region formed in the n-type silicon semiconductor substrate 1. A p-type RESURF region 21 is formed under the recessed region, and an Al—Si electrode 26 (field plate) is provided on the p-type RESURF region 21 through the insulating film 23. Further, a p-type anode region 20 is formed in the vicinity of the surface of the n-type silicon semiconductor substrate 1, and an anode electrode 22 is provided on the p-type anode region 20. Note that an n-type channel stopper region 24 is formed under the Al—Si electrode 26 in the vicinity of the surface of the n-type silicon semiconductor substrate 1, and a cathode electrode 25 is provided on a back surface of the n-type silicon semiconductor substrate 1.

Figure 11:
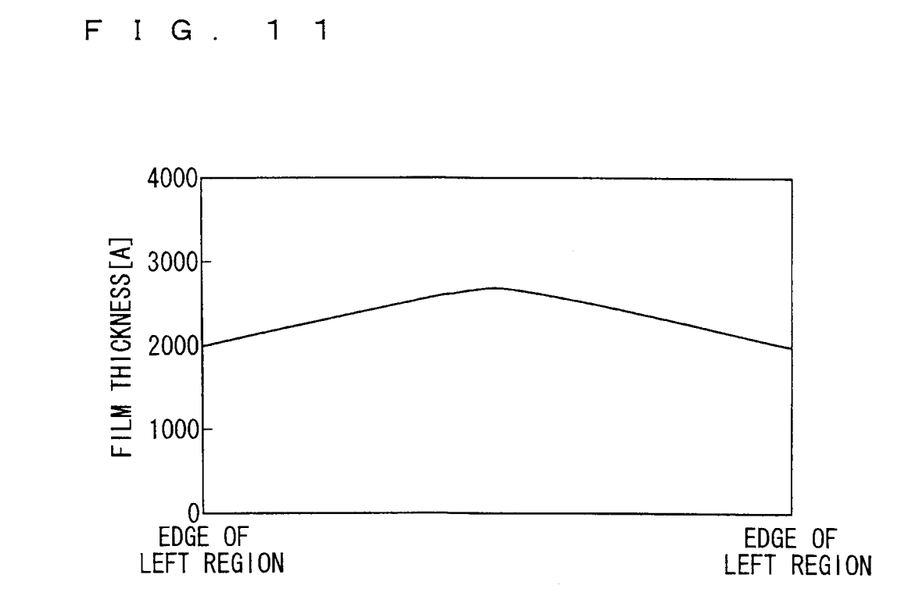
FIGS. 11 and 12 are views showing distribution of thickness of an insulating film after the CMP process according to the underlying technology of the present invention.
Figure 12:
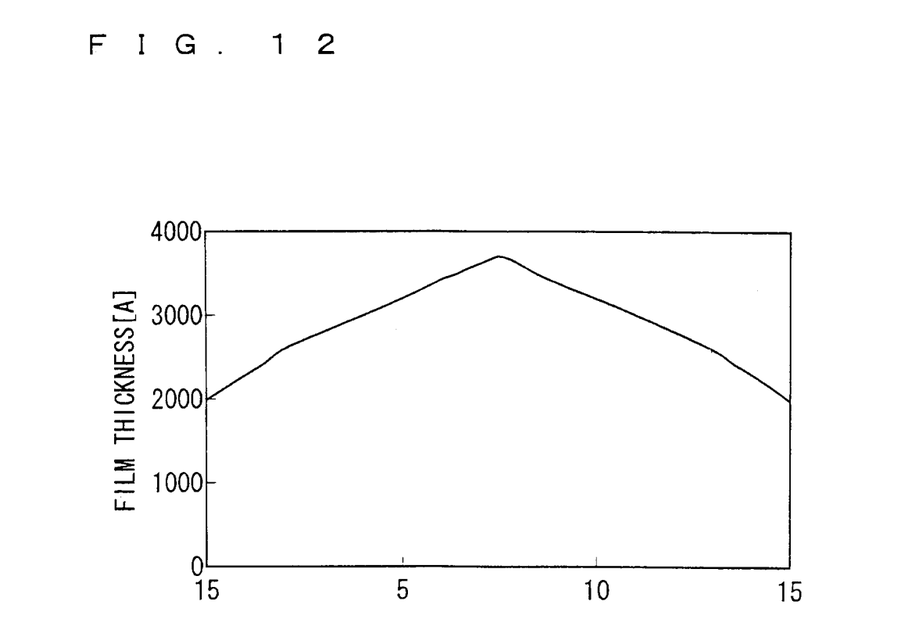

FIGS. 11 and 12 show the distribution of thickness of the insulating film following the CMP process after the insulating film is formed to have a thickness of 2 μm in the underlying technology of the present invention, where FIG. 11 shows the distribution of the insulating film in a case of the transistor cell region of 5 mm□, and FIG. 12 shows the distribution of the insulating film in a case of the transistor cell region of 10 mm□. FIGS. 11 and 12 reveal that the distribution of film thickness becomes larger after the CMP process as the transistor cell region that is a non-recessed region becomes wider (unevenness in film thickness increases). Accordingly, as described above, larger unevenness in film thickness results in a problem of unevenness in characteristics.

The present invention has been made to solve the above-mentioned problem, which is described below in detail.

First Preferred Embodiment

Figure 1:
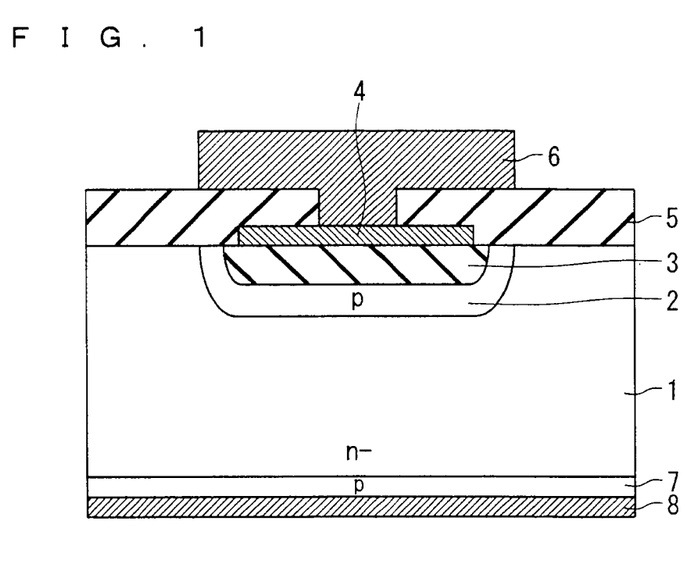
FIG. 1 is a cross-sectional view showing a configuration of a gate wiring region of a power semiconductor device according to a first preferred embodiment of the present invention.

FIG. 1 is a cross-sectional view showing a configuration of a gate wiring region of a power semiconductor device according to a first preferred embodiment of the present invention. Note that the power semiconductor device according to this preferred embodiment is provided in accordance with a typical chip layout as shown in, for example, FIG. 8, which has a termination region 11 (termination structure) in which a field plate is provided on an insulating film filled in a recessed region (first recessed region) formed in a semiconductor substrate as shown in FIG. 10, and includes a plurality of transistor cell regions 10 (unit cells) connected in parallel. The gate wiring electrically connected to respective gate electrodes of the plurality of transistor cell regions 10 are disposed in a gate wiring region 12, and a gate pad 13 (gate pad region) is electrically connected to the gate wiring region 12.

As shown in FIG. 1, in the gate wiring region of the power semiconductor device according to this preferred embodiment, the recessed region is provided in a p-type well region 2 formed in the vicinity of the surface of an n-type silicon semiconductor substrate 1 (semiconductor substrate), and an insulating film 3 is filled in the recessed region so as to be flush with the surface of the n-type silicon semiconductor substrate 1. A gate electrode 4, an interlayer film 5 and an Al—Si electrode 6 are provided on the insulating film 3, and a p-type collector layer 7 and a collector electrode 8 are sequentially provided on the back surface of the n-type silicon semiconductor substrate 1. That is, the gate wiring region of the power semiconductor device according to the first preferred embodiment is characterized in that the Al—Si electrode 6 (gate wiring region) is disposed on the insulating film 3 filled in a recessed region (second recessed region) formed in the n-type silicon semiconductor substrate 1, compared with a conventional case (for example, FIG. 9).

The structure in which the insulating film 3 is filled in the recessed region (second recessed region) formed in the n-type silicon semiconductor substrate 1 is the same as the structure in which the insulating film is filled in the recessed region (first recessed region) in the termination structure, and thus both structures can be formed at the same time. That is, the same insulating film 3 is filled in both structures.

In forming the termination structure, first, a resist pattern is formed on the n-type silicon semiconductor substrate 1 by photolithography, and then the recessed regions (first and second recessed regions) are formed in the n-type silicon semiconductor substrate 1 by, for example, dry etching. After that, the insulating film 3 is formed on an entire surface of the n-type silicon semiconductor substrate 1 by, for example, chemical vapor deposition (CVD), and then the surface is planarized by the CMP process. In the CMP process, the insulating film 3 formed on the region other than the recessed region (non-recessed region including the transistor cell region 10) is required to be left for avoiding damage on the n-type silicon semiconductor substrate 1. Unevenness in thickness of the insulating film 3 after the CMP process increases as the non-recessed region becomes wider. However, the recessed region is formed under the gate wiring region 12 as in the termination structure, and the transistor cell regions 10 are divided into a plurality of regions by the gate wiring region 12 (the non-recessed region is also divided into a plurality of regions by a recessed region under the gate wiring) as shown in the layout of FIG. 8, whereby it is possible to reduce unevenness in thickness of the insulating film 3 on an entire surface of the n-type silicon semiconductor substrate 1.

As can be seen from the above, it is possible to reduce unevenness in thickness of an insulating film after the CMP process by forming a recessed region under a gate wiring region and filling the insulating film in the recessed region, which enables a reduction of unevenness in characteristics of a power semiconductor device. Further, the insulating film 3 under the gate electrode 4 is filled in the recessed region of the n-type silicon semiconductor substrate 1, and thus the step due to the insulating film 3 can be reduced in wafer processing, which improves a focus margin of photolithography.

Second Preferred Embodiment

Figure 2:
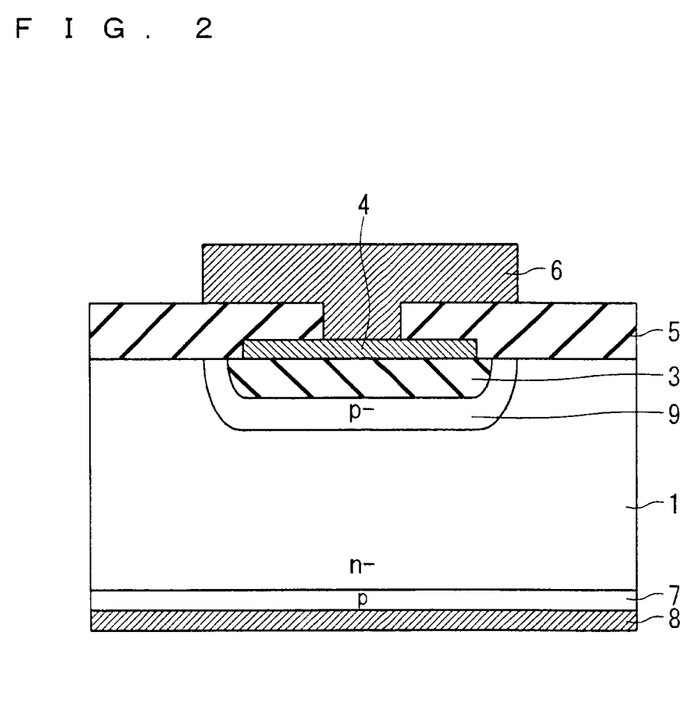
FIG. 2 is a cross-sectional view showing a configuration of a gate wiring region of a power semiconductor device according to a second preferred embodiment of the present invention.

FIG. 2 is a cross-sectional view showing a configuration of a gate wiring region of a power semiconductor device according to a second preferred embodiment of the present invention. As shown in FIG. 2, the second preferred embodiment of the present invention is characterized in that a p-type well region 9 (second impurity region) of low impurity concentration that is formed by ion implantation in which an implantation amount is approximately $1.0E12$ atoms/cm$^2$ is provided under the recessed region (second recessed region) formed in the n-type silicon semiconductor substrate 1. Other configuration is similar to that of the first preferred embodiment, and thus description thereof is omitted here.

In a case where the termination structure is the RESURF structure, a p-type RESURF layer (first impurity region) formed by ion implantation in which an implantation amount is approximately $1.0E12$ atoms/cm$^2$ is formed under the recessed region (first recessed region) of the termination structure. By making the impurity concentration the same in the p-type RESURF layer and the p-type well region 9 (that is, making the p-type region of lower impurity concentration that is lower than the p-type active region of the transistor cell region 10), photolithography and ion implantation required for the formation of the p-type well region 9 under the Al—Si electrode 6 (gate wiring region) can be omitted.

From the above, in addition to the effects of the first preferred embodiment, photolithography and ion implantation required for the formation of the p-type well region 9 can be omitted.

Third Preferred Embodiment

Figure 4:
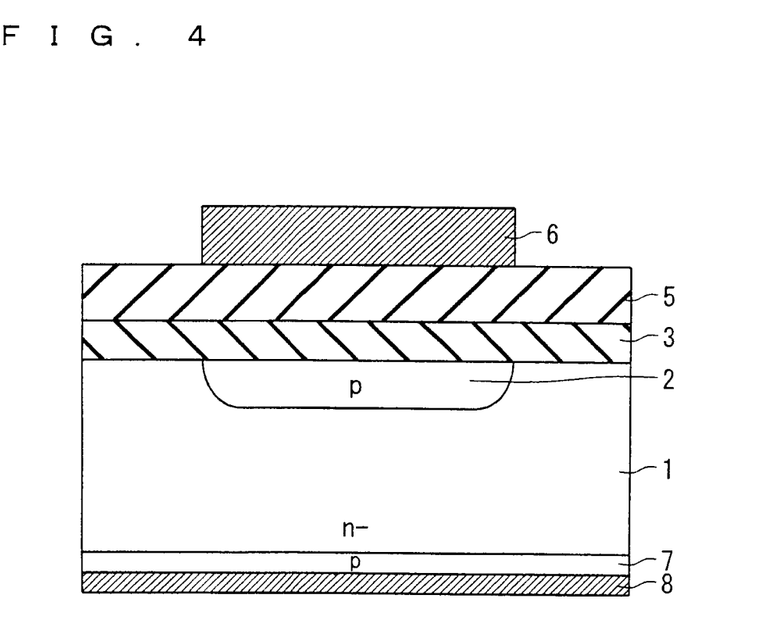
FIG. 4 is a cross-sectional view showing a configuration of a gate pad of a conventional power semiconductor device.

A third preferred embodiment of the present invention is characterized in that the Al—Si electrode 6 (gate pad region) is disposed above the insulating film 3 filled in a recessed region (third recessed region) formed in the n-type silicon semiconductor substrate 1 (semiconductor substrate). FIG. 4 is a cross-sectional view showing a configuration of a gate pad of a conventional power semiconductor device. As shown in FIG. 4, conventionally, the Al—Si electrode 6 (gate pad region) is disposed on the n-type silicon semiconductor substrate 1 through the insulating film 3 and the interlayer film 5. On the Al—Si electrode 6, the gate pad is electrically connected to a gate drive circuit by wire bonding or the like. Conventionally, the thickness of an insulating film formed on the n-type silicon semiconductor substrate 1 is a sum of the thickness of the insulating film 3 and the thickness of the interlayer film 5 as described above, which causes a problem that a step due to the insulating film pattern becomes large in the wafer processing.

Figure 3:
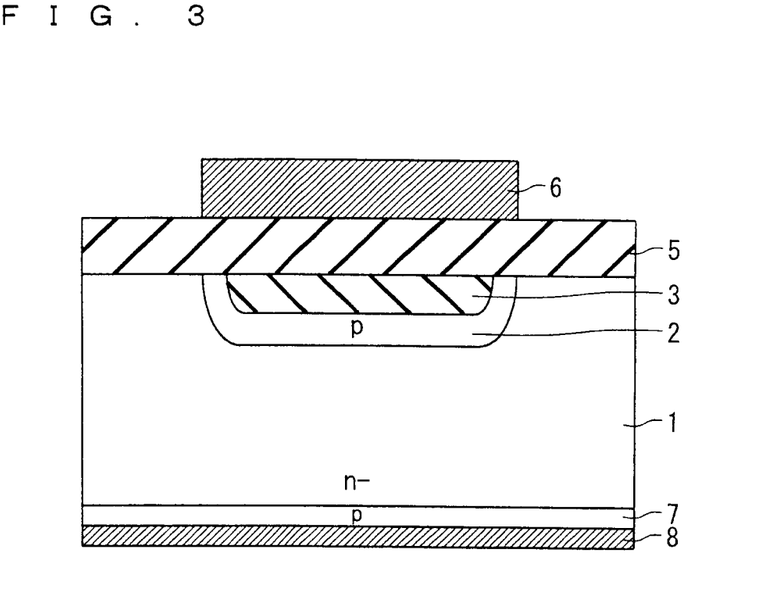
FIG. 3 is a cross-sectional view showing a configuration of a gate pad of a power semiconductor device according to a third preferred embodiment of the present invention.

As a measure taken against the above-mentioned problem, in the gate pad of the power semiconductor device according to the third preferred embodiment shown in FIG. 3, the insulating film 3 is filled in the recessed region formed in the n-type silicon semiconductor substrate 1 under the Al—Si electrode 6 (gate pad region). Therefore, it is possible to reduce a step due to an insulating film pattern in the wafer process. Note that a gate wiring region in this case may be any of the configurations according to the first and second preferred embodiments.

From the above, a step due to an insulating film pattern in the wafer process can be reduced with such a configuration that the Al—Si electrode 6 is disposed on the insulating film 3 filled in the recessed region formed in the n-type silicon semiconductor substrate 1.

Note that the gate wiring region according to the third preferred embodiment may be any of the configurations according to the first and second preferred embodiments.

Fourth Preferred Embodiment

Figure 5:
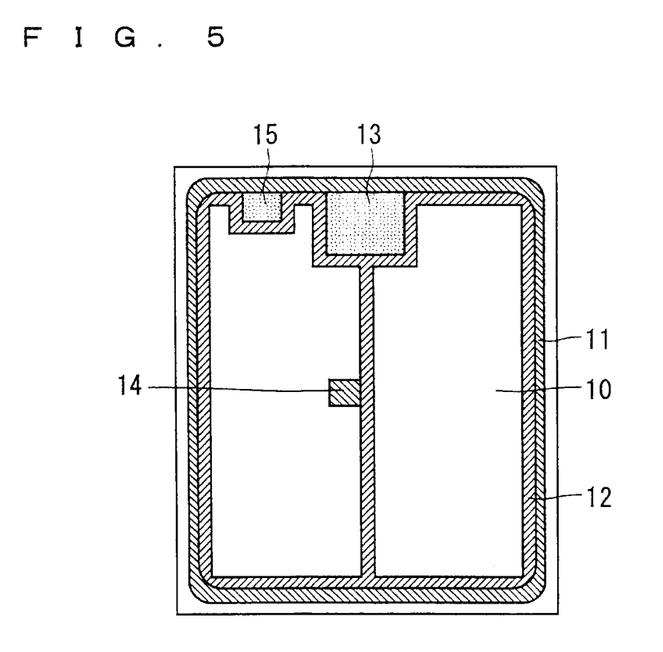
FIG. 5 is a plan view showing an example of a chip layout of a typical IGBT including a temperature sensing diode.
Figure 6:
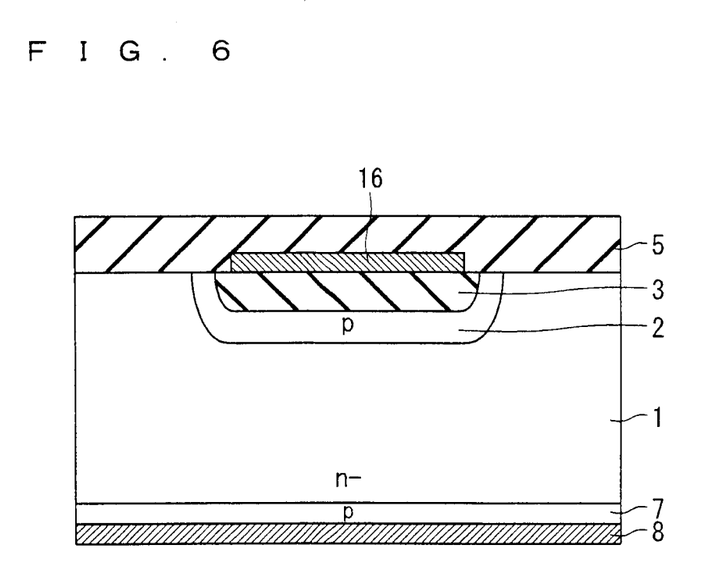
FIG. 6 is a cross-sectional view showing a configuration of a temperature sensing diode region of a power semiconductor device according to a fourth preferred embodiment of the present invention.

FIG. 5 is a plan view showing an example of a chip layout of a typical IGBT including a temperature sensing diode, where a temperature sensing diode region 14 and a temperature sensing diode pad 15 are provided in the chip layout of a typical IGBT shown in FIG. 8. FIG. 6 is a cross-sectional view showing a configuration of the temperature sensing diode region 14 of a power semiconductor device according to a fourth preferred embodiment of the present invention.

As shown in FIGS. 5 and 6, a temperature sensing diode that is a thin film PN diode including a doped polysilicon film 16 is disposed in the temperature sensing diode region 14. The PN diode has temperature dependence in output characteristics, and thus the temperature of the power semiconductor device according to the fourth preferred embodiment can be monitored by monitoring output characteristics of the temperature sensing diode. The temperature sensing diode pad 15 is an electrode pad provided for electrical connection between the temperature sensing diode region 14 and an external control circuit.

Further, as shown in FIG. 6, the doped polysilicon film 16 (temperature sensing diode region 14) is formed on the insulating film 3 filled in a recessed region (fourth recessed region) formed in the n-type silicon semiconductor substrate 1. Further, though not shown, the temperature sensing diode pad 15 is disposed on the insulating film 3 filled in a recessed region (fifth recessed region) formed in the n-type silicon semiconductor substrate 1.

Figure 7:
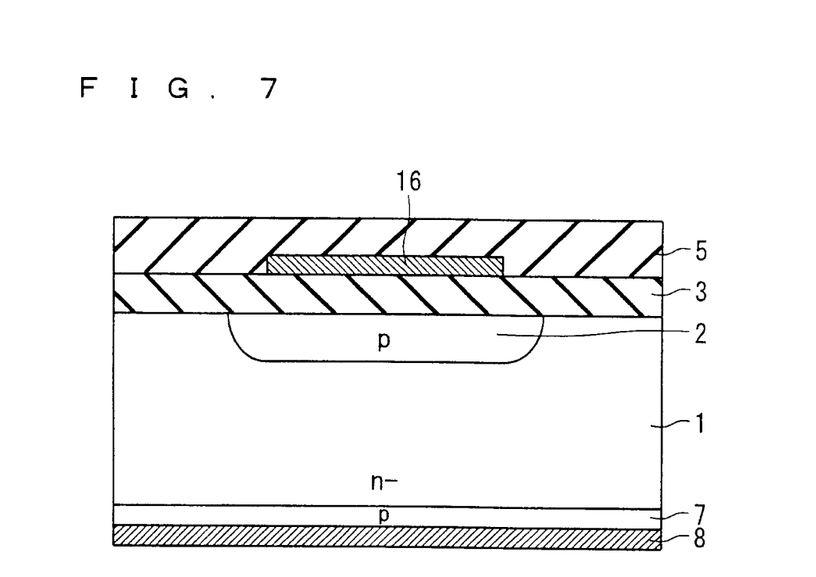
FIG. 7 is a cross-sectional view showing a configuration of a temperature sensing diode region of a conventional power semiconductor device.

Comparing the configuration (FIG. 6) of the temperature sensing diode region according to the fourth preferred embodiment and the configuration (FIG. 7) of a conventional temperature sensing diode region, the insulating film 3 is formed on the n-type silicon semiconductor substrate 1 in the conventional case, and accordingly, a step is caused due to a pattern of the insulating film 3 in a wafer process. However, in the fourth preferred embodiment, the insulating film 3 is filled in the recessed region formed in the n-type silicon semiconductor substrate 1, whereby it is possible to reduce a step due to an insulating film pattern in the wafer process.

As can be seen from the above, it is possible to reduce a step due to an insulating film pattern in the wafer process by configuring the temperature sensing diode region 14 and the temperature sensing diode pad 15 so as to be each disposed on the insulating film 3 filled in the recessed regions (fourth and fifth recessed regions) formed in the n-type silicon semiconductor substrate 1.

Note that the gate wiring region and the gate pad in the fourth preferred embodiment may be any one of the first to third preferred embodiments or may be a combination thereof.

Fifth Preferred Embodiment

A fifth preferred embodiment of the present invention is characterized in that a semiconductor substrate other than a silicon semiconductor substrate, such as a silicon carbide (SiC) substrate and a gallium nitride (GaN) substrate, is used in place of the silicon semiconductor substrate according to any of the first to fourth preferred embodiments.

As described above, the effects similar to those of the first to fourth preferred embodiments can be obtained also with the use of a semiconductor substrate other than a silicon semiconductor substrate.

While the invention has been shown and described in detail, the foregoing description is in all aspects illustrative and not restrictive. It is therefore understood that numerous modifications and variations can be devised without departing from the scope of the invention.

What is claimed is:

1. A power semiconductor device, which has a termination structure in which a field plate is provided on an insulating film filled in a first recessed region formed in a semiconductor substrate and includes a plurality of unit cells connected in parallel, comprising:

a gate wiring region in which gate wiring electrically connected to each gate electrode of said plurality of unit cells is provided; and a gate pad region electrically connected to said gate wiring region, wherein:

said gate wiring region is disposed on said insulating film filled in a second recessed region formed in said semiconductor substrate;

a first impurity region and a second impurity region are provided under said first recessed region and said second recessed region, respectively; and said first impurity region and said second impurity region are each a p-type region having a lower impurity concentration than that of a p-type active region of said unit cell.

2. The power semiconductor device according to claim 1, wherein said first impurity region and said second impurity region are each formed by ion implantation in which an implantation amount is approximately $1.0E12$ atoms/cm$^2$.

3. The power semiconductor device according to claim 1, wherein said gate pad region is disposed on said insulating film filled in a third recessed region formed in said semiconductor substrate.

4. The power semiconductor device according to claim 1, further comprising:

a temperature sensing diode region including a temperature sensing diode disposed therein; and a temperature sensing diode pad electrically connected to said temperature sensing diode region, wherein:

said temperature sensing diode region is disposed on said insulating film filled in a fourth recessed region formed in said semiconductor substrate; and said temperature sensing diode pad is disposed on said insulating film filled in a fifth recessed region formed in said semiconductor substrate.

5. The power semiconductor device according to claim 1, wherein said semiconductor substrate is any of a silicon (Si) substrate, a silicon carbide (SiC) substrate and a gallium nitride (GaN) substrate.

* * * * *